United States Patent
Kim et al.

(10) Patent No.: US 10,056,575 B2
(45) Date of Patent: Aug. 21, 2018

(54) FLEXIBLE DISPLAY APPARATUS, ORGANIC LIGHT EMITTING DISPLAY APPARATUS, AND MOTHER SUBSTRATE FOR FLEXIBLE DISPLAY APPARATUS

(71) Applicant: SAMSUNG DISPLAY CO., LTD., Yongin-si, Gyeonggi-do (KR)

(72) Inventors: Hyung-Sik Kim, Yongin-si (KR); Sung-Guk An, Yongini-si (KR); Yong-Hwan Park, Yongin-si (KR); Jae-Seob Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/344,287

(22) Filed: Nov. 4, 2016

(65) Prior Publication Data

US 2017/0077452 A1    Mar. 16, 2017

Related U.S. Application Data

(63) Continuation of application No. 13/787,671, filed on Mar. 6, 2013, now Pat. No. 9,516,745.

(30) Foreign Application Priority Data

Mar. 21, 2012  (KR) .................. 10-2012-0028955

(51) Int. Cl.
*H01L 51/50* (2006.01)
*H01L 27/32* (2006.01)
(Continued)

(52) U.S. Cl.
CPC ...... *H01L 51/5253* (2013.01); *H01L 27/3244* (2013.01); *H01L 51/0097* (2013.01);
(Continued)

(58) Field of Classification Search
CPC ............. H01L 2251/5338; H01L 51/50; H01L 51/0097; H01L 51/5008
See application file for complete search history.

(56) References Cited

U.S. PATENT DOCUMENTS 4,640,583 A * 2/1987 Hoshikawa ........... G02F 1/1341
    349/122
6,476,885 B1 * 11/2002 Murray ............... G02F 1/13452
    349/150
(Continued)

FOREIGN PATENT DOCUMENTS

KR    10-0712103 B1    5/2007
KR    10-0735215 B1    7/2007
(Continued)

OTHER PUBLICATIONS

Korean Patent Abstracts No. 10-2006-0059076 A for Publication No. 10-0712103 B1 (p. 1).
(Continued)

*Primary Examiner* — Maliheh Malek
(74) *Attorney, Agent, or Firm* — Lewis Roca Rothgerber Christie LLP

(57) ABSTRACT

A flexible display apparatus, an organic light emitting display apparatus, and a mother substrate for flexible display apparatus that have improved durability and image quality. The flexible display apparatus includes a flexible substrate, a display region that is defined on the flexible substrate and that comprises a pixel unit and a circuit unit, a pad unit that is formed adjacent to the display region, and a deformation prevention unit that is disposed around the display region, that is separated from the pad unit, and that comprises a material having a greater rigidity than that of the flexible substrate.

19 Claims, 5 Drawing Sheets

(51) Int. Cl.
*H05K 1/02* (2006.01)
*H01L 51/52* (2006.01)
*H01L 51/00* (2006.01)

(52) U.S. Cl.
CPC ...... *H01L 51/5008* (2013.01); *H01L 51/5012* (2013.01); *H01L 51/5206* (2013.01); *H01L 51/5221* (2013.01); *H05K 1/0281* (2013.01); *H01L 27/3276* (2013.01); *H01L 2251/5338* (2013.01); *Y02E 10/549* (2013.01); *Y02P 70/521* (2015.11)

(56) References Cited

U.S. PATENT DOCUMENTS

| | | | | |
|---|---|---|---|---|
| 7,662,011 B2* | 2/2010 | Yamazaki | H01L 27/3246 | 427/66 |
| 7,944,142 B2* | 5/2011 | Nakanishi | H01L 27/3276 | 257/79 |
| 7,982,395 B2* | 7/2011 | Kwon | H01L 27/3276 | 313/331 |
| 8,044,411 B2* | 10/2011 | Maruyama | H01L 51/524 | 257/79 |
| 8,508,125 B2* | 8/2013 | Stryakhilev | H01L 27/1248 | 313/504 |
| 8,520,180 B2* | 8/2013 | Tsai | G02F 1/133305 | 349/153 |
| 8,656,859 B2* | 2/2014 | Hong | H01L 51/0011 | 118/504 |
| 8,890,166 B2* | 11/2014 | Sakakura | H01L 27/1225 | 257/72 |
| 8,936,952 B2* | 1/2015 | Chida | H01L 21/02554 | 438/158 |
| 9,028,123 B2* | 5/2015 | Nichol | G02B 6/0076 | 349/63 |
| 9,245,468 B2* | 1/2016 | Lee | G09G 3/006 | |
| 9,276,055 B1* | 3/2016 | Son | H01L 27/3276 | |
| 9,668,318 B2* | 5/2017 | Choi | H01L 51/524 | |
| 9,760,125 B2* | 9/2017 | Kim | G06F 1/1652 | |
| 2002/0070382 A1* | 6/2002 | Yamazaki | G02F 1/13454 | 257/72 |
| 2003/0089991 A1* | 5/2003 | Yamazaki | H01L 29/66757 | 257/759 |
| 2004/0052037 A1* | 3/2004 | Sawyer | G06F 1/1601 | 361/679.05 |
| 2004/0104197 A1* | 6/2004 | Shigemura | C23C 14/042 | 216/20 |
| 2004/0238827 A1* | 12/2004 | Takayama | H01L 27/1214 | 257/79 |
| 2005/0168141 A1* | 8/2005 | Henseler | H01L 51/0097 | 313/506 |
| 2005/0205888 A1* | 9/2005 | Miyasaka | G02F 1/13454 | 257/99 |
| 2005/0206600 A1* | 9/2005 | Miyasaka | G02F 1/13452 | 345/92 |
| 2006/0044237 A1* | 3/2006 | Lee | G09G 3/3233 | 345/82 |
| 2006/0055314 A1* | 3/2006 | Nakamura | H01L 51/0004 | 313/500 |
| 2006/0061524 A1* | 3/2006 | Suh | G09G 3/3216 | 345/76 |
| 2006/0077144 A1* | 4/2006 | Eom | G09G 3/32 | 345/82 |
| 2006/0081975 A1* | 4/2006 | Kang | H01L 51/0015 | 257/697 |
| 2006/0082716 A1* | 4/2006 | Lebrun | G02F 1/1339 | 349/153 |
| 2006/0109413 A1* | 5/2006 | Lee | H01L 51/5246 | 349/153 |
| 2006/0244741 A1* | 11/2006 | Kimura | G02F 1/13452 | 345/204 |
| 2007/0049033 A1* | 3/2007 | Lee | C23C 14/042 | 438/692 |
| 2007/0054440 A1* | 3/2007 | Hu | H01L 21/2007 | 438/142 |
| 2007/0075316 A1* | 4/2007 | Yamazaki | H01L 27/32 | 257/72 |
| 2007/0085838 A1* | 4/2007 | Ricks | G06F 3/0412 | 345/173 |
| 2007/0147473 A1* | 6/2007 | Wolkin | G01K 7/22 | 374/208 |
| 2007/0263407 A1* | 11/2007 | Sakai | G02B 6/0021 | 362/608 |
| 2008/0012012 A1* | 1/2008 | Hara | H01L 27/283 | 257/40 |
| 2008/0042940 A1* | 2/2008 | Hasegawa | G02F 1/167 | 345/76 |
| 2008/0074042 A1* | 3/2008 | Itai | H01L 51/524 | 313/504 |
| 2008/0106196 A1* | 5/2008 | Woo | H01J 9/261 | 313/582 |
| 2008/0136994 A1* | 6/2008 | Lee | G02F 1/133604 | 349/58 |
| 2008/0160864 A1* | 7/2008 | Song | H01L 51/525 | 445/3 |
| 2008/0204618 A1* | 8/2008 | Jung | G02F 1/13452 | 349/40 |
| 2009/0309101 A1* | 12/2009 | Kim | G02F 1/136213 | 257/59 |
| 2009/0322998 A1* | 12/2009 | Jung | G02F 1/1345 | 349/122 |
| 2010/0002404 A1* | 1/2010 | Fujita | H05K 1/0271 | 361/752 |
| 2010/0117999 A1* | 5/2010 | Matsunaga | H05B 33/12 | 345/204 |
| 2010/0123160 A1* | 5/2010 | Hatano | H01L 27/3251 | 257/99 |
| 2010/0157180 A1* | 6/2010 | Doane | G02F 1/1334 | 349/25 |
| 2010/0171138 A1* | 7/2010 | Yamazaki | H01L 27/3246 | 257/98 |
| 2010/0213833 A1* | 8/2010 | Kawachi | H01L 51/5203 | 313/504 |
| 2010/0244005 A1* | 9/2010 | Gyoda | H01L 51/5237 | |
| 2010/0245751 A1* | 9/2010 | Muneyoshi | G02F 1/133305 | 349/149 |
| 2010/0253656 A1* | 10/2010 | Fujikawa | G02F 1/1339 | 345/204 |
| 2010/0320909 A1* | 12/2010 | Izumi | H01L 27/3246 | 315/51 |
| 2011/0007042 A1* | 1/2011 | Miyaguchi | G02F 1/133305 | 345/204 |
| 2011/0032223 A1* | 2/2011 | Okamoto | G02F 1/167 | 345/204 |
| 2011/0050657 A1* | 3/2011 | Yamada | H01L 27/3293 | 345/204 |
| 2011/0051334 A1* | 3/2011 | Griffith | G06F 3/03547 | 361/679.01 |
| 2011/0067630 A1* | 3/2011 | Ko | C23C 14/042 | 118/721 |
| 2011/0084266 A1* | 4/2011 | Yamazaki | H01L 27/1225 | 257/43 |
| 2011/0108809 A1* | 5/2011 | Seo | H01L 51/524 | 257/40 |
| 2011/0133637 A1* | 6/2011 | Ota | H01L 51/5246 | 313/504 |
| 2011/0186869 A1 | 8/2011 | Hong | | |
| 2011/0229633 A1* | 9/2011 | Hong | H01L 51/0011 | 427/162 |
| 2011/0254758 A1* | 10/2011 | Lin | G02B 26/001 | 345/84 |
| 2011/0279026 A1* | 11/2011 | Boerner | H01L 51/50 | 313/504 |
| 2011/0318889 A1* | 12/2011 | Chida | H01L 21/02554 | 438/158 |
| 2012/0020056 A1* | 1/2012 | Yamagata | G02F 1/133308 | 362/97.1 |

(56) References Cited

U.S. PATENT DOCUMENTS

| | | | | |
|---|---|---|---|---|
| 2012/0025354 A1* | 2/2012 | Sasaki | H01L 21/561 | 257/620 |
| 2012/0044617 A1* | 2/2012 | Lo | G06F 1/1616 | 361/679.01 |
| 2012/0056859 A1* | 3/2012 | Chen | G09G 3/20 | 345/204 |
| 2012/0062814 A1* | 3/2012 | Yamazaki | G02F 1/1333 | 349/43 |
| 2012/0146886 A1* | 6/2012 | Minami | H01L 27/3276 | 345/80 |
| 2012/0235138 A1* | 9/2012 | Shieh | H01L 27/1225 | 257/43 |
| 2012/0242610 A1* | 9/2012 | Yasumatsu | G06F 3/045 | 345/173 |
| 2012/0262660 A1* | 10/2012 | Fujiwara | G02F 1/1333 | 349/158 |
| 2012/0286245 A1* | 11/2012 | Levermore | H01L 51/0097 | 257/40 |
| 2013/0002133 A1* | 1/2013 | Jin | H01L 51/524 | 313/511 |
| 2013/0002572 A1* | 1/2013 | Jin | G02F 1/133305 | 345/173 |
| 2013/0002583 A1* | 1/2013 | Jin | G06F 1/1637 | 345/173 |
| 2013/0025647 A1* | 1/2013 | Bouten | B32B 27/065 | 136/244 |
| 2013/0076268 A1* | 3/2013 | Choi | H01L 51/524 | 315/312 |
| 2013/0109116 A1* | 5/2013 | Cavuoti | C03C 15/02 | 438/27 |
| 2013/0194204 A1* | 8/2013 | Kang | G06F 3/041 | 345/173 |
| 2013/0201575 A1* | 8/2013 | Cheon | F21V 11/00 | 359/893 |
| 2013/0234734 A1* | 9/2013 | Iida | G06F 3/044 | 324/661 |
| 2013/0240855 A1* | 9/2013 | Chida | H01L 51/5237 | 257/40 |
| 2013/0271677 A1* | 10/2013 | Koo | G02F 1/1333 | 349/33 |
| 2014/0055328 A1* | 2/2014 | Osako | H05K 1/0203 | 345/87 |
| 2014/0070203 A1* | 3/2014 | Tanaka | H01L 51/003 | 257/40 |
| 2014/0217383 A1* | 8/2014 | Park | H01L 51/56 | 257/40 |
| 2014/0306941 A1* | 10/2014 | Kim | H04M 1/0268 | 345/204 |
| 2014/0368230 A1* | 12/2014 | Tsurume | G01R 31/2884 | 324/762.01 |
| 2015/0129858 A1* | 5/2015 | Sakakura | H01L 51/5237 | 257/40 |
| 2015/0194448 A1 | 7/2015 | Chida | | |
| 2016/0103537 A1* | 4/2016 | Park | G06F 3/0412 | 345/174 |
| 2016/0190185 A1* | 6/2016 | Cavuoti | C03C 15/02 | 438/27 |
| 2016/0306472 A1* | 10/2016 | Park | G06F 3/0412 | |
| 2017/0170253 A1* | 6/2017 | Kim | H01L 51/5253 | |
| 2017/0263881 A1* | 9/2017 | Choi | H01L 51/524 | |

FOREIGN PATENT DOCUMENTS

| | | |
|---|---|---|
| KR | 10-0813343 B1 | 3/2008 |
| KR | 10-2009-0097003 | 9/2009 |
| KR | 10-2011-0066811 A | 6/2011 |
| KR | 10-2011-0090028 | 8/2011 |
| KR | 10-2012-0000497 | 1/2012 |

OTHER PUBLICATIONS

Korean Patent Abstracts No. 10-2007-0021490 A for Publication No. 10-0735215 B1 (p. 1).

Korean Patent Abstracts No. 10-2005-0018326 A for Publication No. 10-0813343 B1 (p. 1).

KIPO Notice of Allowance dated Nov. 22, 2017, for corresponding Korean Patent Application No. 10-2012-0028955 (51 pages).

* cited by examiner

FLEXIBLE DISPLAY APPARATUS, ORGANIC LIGHT EMITTING DISPLAY APPARATUS, AND MOTHER SUBSTRATE FOR FLEXIBLE DISPLAY APPARATUS

CROSS-REFERENCE TO RELATED PATENT APPLICATION

This application is a continuation application of U.S. patent application Ser. No. 13/787,671, filed on Mar. 6, 2013, now U.S. Pat. No. 9,516,745, which claims priority to and the benefit of Korean Patent Application No. 10-2012-0028955, filed on Mar. 21, 2012 in the Korean Intellectual Property Office, the disclosures of which are incorporated herein in their entireties by reference.

BACKGROUND

1. Field

Embodiments of the present invention relate to a flexible display apparatus, an organic light emitting display apparatus, and a mother substrate for flexible display apparatus.

2. Description of the Related Art

Recently, portable thin flat panel display devices have been used as display devices. Also, recently, applications and usages of a flexible display apparatus that can be bent according to a user's desire are increased, and thus the flexible display apparatus is widely used.

The flexible display apparatus is manufactured by using a substrate formed of a flexible material.

However, when the flexible display apparatus is manufactured, the flexible substrate is partially shriveled during an extension process and a film lamination process, such that the flexible substrate may be abnormally deformed. Due to the deformation, it is not easy to accurately control a subsequent process. That is, accuracy of a pattern formed in the subsequent process deteriorates. Due to the deterioration, an improvement in an image quality of the flexible display apparatus is limited.

Also, due to the deformation, the flexible substrate and a plurality of layers formed on the flexible substrate become unstable such that an improvement in durability of the flexible display apparatus is limited.

SUMMARY

Embodiments of the present invention provide a flexible display apparatus, an organic light emitting display apparatus, and a mother substrate for flexible display apparatus which have improved durability and image quality.

According to an embodiment of the present invention, there is provided a flexible display apparatus including a flexible substrate; a display region defined on the flexible substrate and including a pixel unit and a circuit unit; a pad unit adjacent to the display region; and a deformation prevention unit around the display region, the deformation prevention unit being separated from the pad unit, and including a material having a greater rigidity than that of the flexible substrate.

The deformation prevention unit may include a metal material.

The deformation prevention unit may correspond to sides of the flexible substrate.

The deformation prevention unit may include a plurality of deformation prevention patterns that are separated from each other.

The deformation prevention unit may longitudinally extend so as to correspond to at least one side surface of the flexible substrate.

The deformation prevention unit may longitudinally extend so as to correspond to side surfaces of the flexible substrate, except for one side surface of the flexible substrate which faces the pad unit.

The flexible substrate may include a pad unit region that longitudinally extends so as to allow the pad unit to be formed therein, and the deformation prevention unit may have an opening that corresponds to the pad unit region.

The flexible display apparatus may further include a thin film transistor (TFT) in the display region, the TFT including an active layer, a gate electrode, a source electrode, and a drain electrode, and the deformation prevention unit may include the same material as at least one of the gate electrode, the source electrode, or the drain electrode.

The flexible display apparatus may further include an interlayer insulating layer between the gate electrode and the source electrode, and between the gate electrode and the drain electrode, and the interlayer insulating layer may be on the deformation prevention unit.

According to another embodiment of the present invention, there is provided an organic light emitting display apparatus including a flexible substrate; a display region defined on the flexible substrate and including a pixel unit and a circuit unit; a pad unit adjacent to the display region; a first electrode in the pixel unit; a second electrode in the pixel unit; an intermediate layer in the pixel unit and between the first electrode and the second electrode, the intermediate layer including an organic emission layer (organic EML); and a deformation prevention unit around the display region, the deformation prevention unit being separated from the pad unit, and including a material having a greater rigidity than that of the flexible substrate.

The deformation prevention unit may include a metal material.

The deformation prevention unit may correspond to sides of the flexible substrate.

The deformation prevention unit may include a plurality of deformation prevention patterns that are separated from each other.

The deformation prevention unit may longitudinally extend so as to correspond to at least one side surface of the flexible substrate.

The deformation prevention unit may longitudinally extend so as to correspond to side surfaces of the flexible substrate, except for one side surface of the flexible substrate which faces the pad unit.

The flexible substrate may include a pad unit region that longitudinally extends so as to allow the pad unit to be formed therein, and the deformation prevention unit may have an opening that corresponds to the pad unit region.

The organic light emitting display apparatus may further include a thin film transistor (TFT) in the display region, the TFT being electrically connected to the first electrode, and including an active layer, a gate electrode, a source electrode, and a drain electrode, and the deformation prevention unit may include the same material as at least one of the gate electrode, the source electrode, or the drain electrode.

The organic light emitting display apparatus may further include an interlayer insulating layer between the gate electrode and the source electrode, and between the gate electrode and the drain electrode, and the interlayer insulating layer may be on the deformation prevention unit.

According to another embodiment of the present invention, there is provided a mother substrate for flexible display apparatus including a plurality of flexible substrates; a plurality of display regions respectively defined on the flexible substrate so as to form a plurality of flexible display apparatuses, the display regions comprise pixel units and circuit units, respectively; a plurality of pad units, each of the pad units being adjacent to a corresponding one of the plurality of display regions; and a plurality of deformation prevention units, each of the deformation prevention units being around a corresponding one of the plurality of display regions, being separated from a corresponding one of the pad units, and including a material having a greater rigidity than that of the flexible substrates.

The deformation prevention units may include a metal material.

One of the deformation prevention units may correspond to sides of a corresponding one of the flexible substrates.

One of the deformation prevention units may include a plurality of deformation prevention patterns that are separated from each other.

One of the deformation prevention units may longitudinally extend so as to correspond to at least one side surface of a corresponding one of the flexible substrates.

One of the deformation prevention unit may longitudinally extend so as to correspond to side surfaces of a corresponding one of the flexible substrates, except for one side surface of the flexible substrate which faces the pad unit.

One of the flexible substrates may include a pad unit region that longitudinally extends so as to allow the pad unit to be formed therein, and the deformation prevention unit may have an opening that corresponds to the pad unit region.

The mother substrate for flexible display apparatus may further include a thin film transistor (TFT) in the display region, the TFT including an active layer, a gate electrode, a source electrode, and a drain electrode, and the deformation prevention unit may include the same material as at least one of the gate electrode, the source electrode, or the drain electrode.

The mother substrate for flexible display apparatus may further include an interlayer insulating layer between the gate electrode and the source electrode, and between the gate electrode and the drain electrode, and the interlayer insulating layer may be formed on a corresponding one of the deformation prevention units.

The mother substrate for flexible display apparatus may further include section lines on the flexible substrates, the section lines being between the plurality of display regions so as to section the plurality of display regions, and the section lines may be configured to be cutting lines, and the deformation prevention units may longitudinally extend so as to correspond to the section lines.

The deformation prevention units may have a lattice form.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Hereinafter, the present invention will be described in detail by explaining exemplary embodiments of the invention with reference to the attached drawings.

As used herein, the term "and/or" includes any and all combinations of one or more of the associated listed items.

Expressions such as "at least one of," when preceding a list of elements, modify the entire list of elements and do not modify the individual elements of the list.

Figure 1:
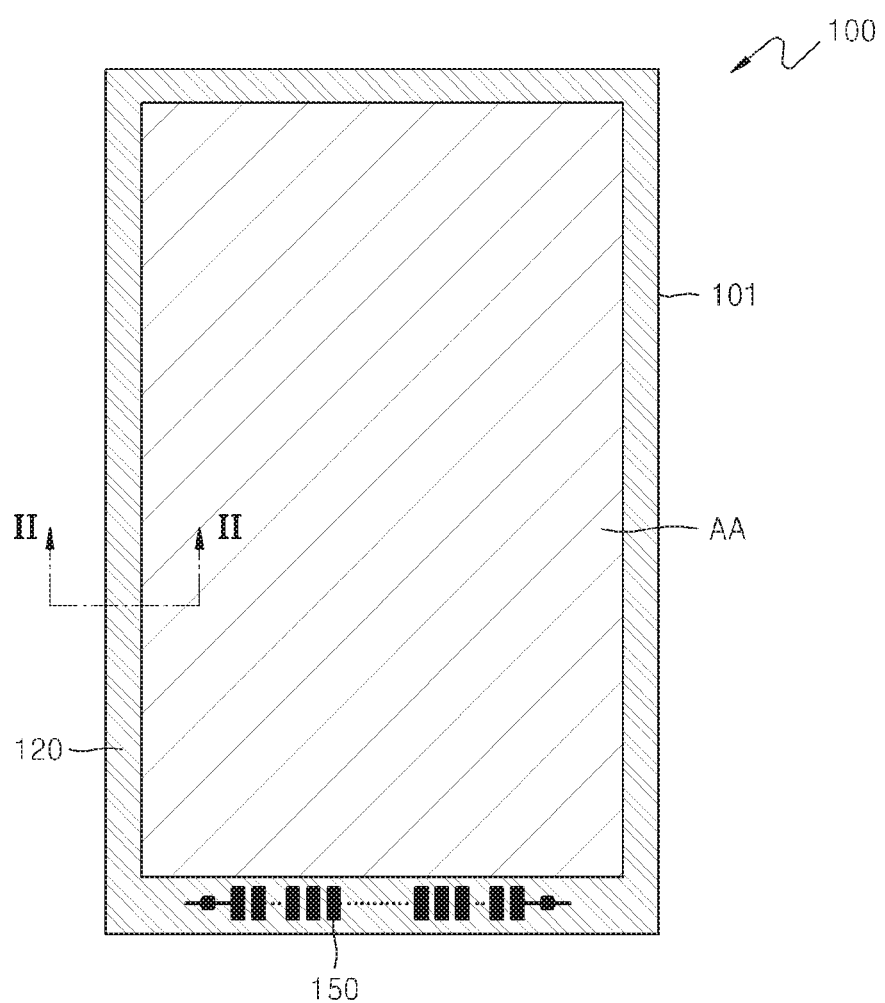
FIG. 1 is a plan view of a flexible display apparatus according to an embodiment of the present invention.
Figure 2:
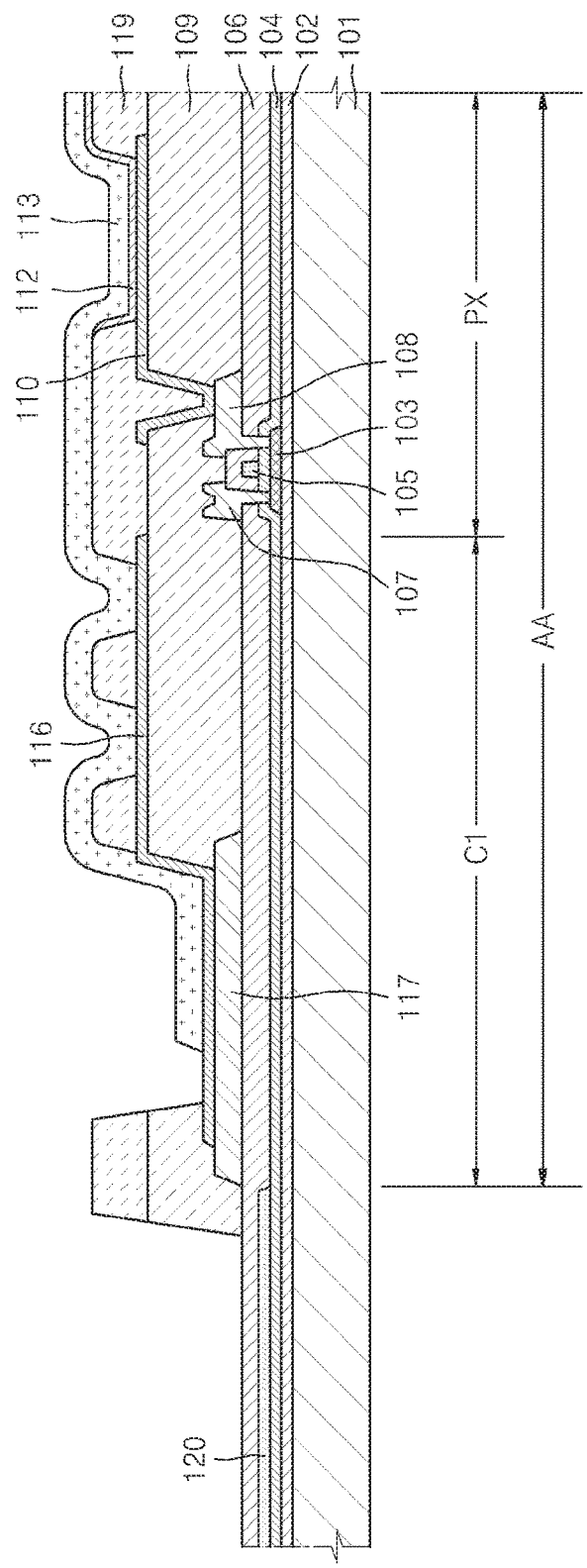
FIG. 2 is a cross-sectional view of the flexible display apparatus of FIG. 1, taken along a line II-II.

FIG. 1 is a plan view of a flexible display apparatus 100 according to an embodiment of the present invention, and FIG. 2 is a cross-sectional view of the flexible display apparatus 100 of FIG. 1, taken along a line II-II.

Referring to FIG. 1, the flexible display apparatus 100 includes a flexible substrate 101 having a display region AA defined thereon, a pad unit 150, and a deformation prevention unit 120.

The flexible substrate 101 is formed of a flexible material so as to be appropriately bent according to a user's desire. For example, the flexible substrate 101 may be formed of a plastic material. Here, the plastic material that forms the flexible substrate 101 may include at least one material selected from various organic materials.

The display region AA is defined on the flexible substrate 101. As illustrated in FIG. 2, a pixel unit PX and a circuit unit C1 are formed in the display region AA. The pixel unit PX corresponds to a region in which a visible ray (or light) is emitted, and includes a first electrode 110, a second electrode 113, and an intermediate layer 112 so as to realize an image. The intermediate layer 112 includes an organic emission layer (e.g., organic EML).

The circuit unit C1 includes various circuit patterns including a power supply pattern, a static electricity prevention pattern, and other various circuit patterns.

The pad unit 150 (shown in FIG. 1) is disposed adjacent to the display region AA. The pad unit 150 delivers an electrical signal from a power supply device (not shown) or a signal generating device (not shown) to the display region AA.

The deformation prevention unit 120 is disposed around the display region AA. The deformation prevention unit 120 is formed of a material having a greater rigidity than that of the flexible substrate 101. Also, the deformation prevention unit 120 is separated from the pad unit 150. For the separation between the deformation prevention unit 120 and the pad unit 150, the deformation prevention unit 120 and the pad unit 150 may be formed on different layers of the flexible display apparatus 100. However, the formation of the deformation prevention unit 120 and the pad unit 150 is not limited thereto. In several embodiments, the deformation prevention unit 120 and the pad unit 150 may be formed on the same layer while they are separated from each other.

A configuration of the flexible display apparatus 100 will now be described in more detail.

A buffer layer 102 is formed on the flexible substrate 101. The buffer layer 102 is formed on an entire surface on the flexible substrate 101, including the display region AA and its adjacent region. The buffer layer 102 may prevent penetration of foreign substances via the flexible substrate 101, may provide a flat surface on the flexible substrate 101, and may be formed of various materials capable of performing the aforementioned functions.

For example, the buffer layer 102 may include inorganic materials such as a silicon oxide, a silicon nitride, a silicon oxynitride, an aluminum oxide, an aluminum nitride, a titanium oxide, a titanium nitride, or the like, may include organic materials such as polyimide, polyester, acryl, or the like, or may be a composite layer formed of a plurality of materials selected from the aforementioned materials. Also, the buffer layer 102 may not be used in various embodiments.

A thin film transistor (TFT) may be arranged in the pixel unit PX on the buffer layer 102. The TFT includes an active layer 103, a gate electrode 105, a source electrode 107, and a drain electrode 108.

First, the active layer 103 having a set or predetermined pattern is formed on the buffer layer 102. The active layer 103 may be formed of an inorganic semiconductor including amorphous silicon or polysilicon, an organic semiconductor, or an oxide semiconductor; and may include a source region, a drain region, and a channel region.

A gate insulating layer 104 is formed on the active layer 103. The gate insulating layer 104 may correspond to an entire surface of the flexible substrate 101. That is, the gate insulating layer 104 is also formed in the display region AA and its adjacent region. The gate insulating layer 104 may be arranged to insulate the active layer 103 from the gate electrode 105 and may be formed of an organic material or an inorganic material such as SiNx, SiO$_2$, and the like.

The gate electrode 105 is formed on the gate insulating layer 104. The gate electrode 105 may include Au, Ag, Cu, Ni, Pt, Pd, Al, Mo, an Al:Nd alloy, or a Mo:W alloy, but is not limited thereto and thus may be formed of various materials, in consideration of a design condition.

Here, the deformation prevention unit 120 is formed around the display region AA. That is, the deformation prevention unit 120 may be formed of the same material as the gate electrode 105. The deformation prevention unit 120 is formed to correspond to the sides of the flexible substrate 101.

Also, the deformation prevention unit 120 has a shape that longitudinally extends so as to correspond to at least one side surface of the flexible substrate 101, and as illustrated in FIG. 1, the deformation prevention unit 120 may have a shape that longitudinally extends so as to correspond to three side surfaces of four side surfaces of the flexible substrate 101, except for one side surface that faces the pad unit 150. That is, the deformation prevention unit 120 is formed to longitudinally extend on the one side surface of the flexible substrate 101 which faces the pad unit 150, but is not formed in a region that corresponds to the pad unit 150 so to be separated from the pad unit 150.

An interlayer insulating layer 106 is formed on the gate electrode 105. The interlayer insulating layer 106 may be formed to correspond to the entire surface of the flexible substrate 101. That is, the interlayer insulating layer 106 is formed at the display region AA and its adjacent region, so that the interlayer insulating layer 106 covers the deformation prevention unit 120.

The source electrode 107 and the drain electrode 108 are formed on the interlayer insulating layer 106. In more detail, the interlayer insulating layer 106 and the gate insulating layer 104 are formed to expose the source region and the drain region of the active layer 103, and the source electrode 107 and the drain electrode 108 are formed to contact the exposed source region and the exposed drain region of the active layer 103.

Here, a power supply wire 117 may be formed at the circuit unit C1. The power supply wire 117 may be formed of the same material as the source electrode 107 or the drain electrode 108.

A passivation layer 109 is formed on the TFT. In more detail, the passivation layer 109 is formed on the source electrode 107 and the drain electrode 108. Also, the passivation layer 109 is formed on a set or predetermined region on the power supply wire 117.

The first electrode 110 is formed on the passivation layer 109. In more detail, the passivation layer 109 is formed not to entirely cover the drain electrode 108 but to expose a set or predetermined portion of the drain electrode 108, and then the first electrode 110 is formed to be connected to the exposed drain electrode 108.

When the first electrode 110 functions as an anode, the first electrode 110 may include ITO, IZO, ZnO, or In$_2$O$_3$ which has a high work function. Also, according to several embodiments, the first electrode 110 may further include a reflective layer formed of Ag, Mg, Al, Pt, Pd, Au, Ni, Nd, Ir, Cr, Li, Yb, or Ca.

A circuit wire 116 is formed at the circuit unit C1. The circuit wire 116 may be formed of the same material as the first electrode 110 and is connected to the power supply wire 117.

A pixel defining layer (PDL) 119 formed of an insulating material is formed on the first electrode 110. The PDL 119 is formed to expose a set or predetermined region of the first electrode 110.

The intermediate layer 112 is formed on the first electrode 110. In more detail, the intermediate layer 112 is formed to contact the exposed first electrode 110.

In more detail, the intermediate layer 112 includes the organic EML so as to emit a visible ray (or light).

The intermediate layer 112 may be formed as a small-molecule organic layer or a polymer organic layer. When the intermediate layer 112 is formed as the small-molecule organic layer, the intermediate layer 112 may include a hole injection layer (HIL), a hole transport layer (HTL), the organic EML, an electron transport layer (ETL), an electron injection layer (EIL), and the like.

The HIL may be formed of a phthalocyanine compound including copper phthalocyanine, or TCTA, m-MTDATA, m-MTDAPB, or the like, which are a starburst-type amine.

The HTL may be formed of N,N'-bis(3-methylphenyl)-N,N'-diphenyl-[1,1-biphenyl]-4,4'-diamine (TPD), N,N'-di (naphthalene-1-yl)-N,N'-diphenyl benzidine (α-NPD), or the like.

The EIL may be formed of lithium fluoride (LiF), sodium chloride (NaCl), caesium fluoride (CsF), lithium oxide (Li2O), barium oxide (BaO), or Liq.

The ETL may be formed of aluminum tris(8-hydroxyquinoline) (Alq3).

The organic EML may include a host material and a dopant material. Examples of the host material of the organic emission layer may include tris(8-hydroxy-quinolinato)aluminum (Alq3), 9,10-di(naphth-2-yl)anthracene (AND), 3-tert-butyl-9,10-di(naphth-2-yl)anthracene (TBADN), 4,4'-bis(2,2-diphenyl-ethene-1-yl)-4,4'-dimethylphenyl (DPVBi), 4,4'-bis(2,2-diphenyl-ethene-1-yl)-4,4'-dimethylphenyl (p-DMDPVBi), tert(9,9-diarylfluorene)s (TDAF), 2-(9,9'-spirobifluorene-2-yl)-9,9'-spirobifluorene (BSDF), 2,7-bis(9,9'-spirobifluorene-2-yl)-9,9'-spirobifluorene (TSDF), bis(9,9-diarylfluorene)s (BDAF), 4,4'-bis(2,2- diphenyl-ethene-1-yl)-4,4'-di-(tert-butyl)phenyl (p-TD-PVBi), 1,3-bis(carbazol-9-yl)benzene (mCP), 1,3,5-tris(carbazol-9-yl)benzene (tCP), 4,4',4"-tris(carbazol-9-yl)triphenylamine (TcTa), 4,4'-bis(carbazol-9-yl)biphenyl (CBP), 4,4'-bis(9-carbazolyl)-2,2'-dimethyl-biphenyl (CBDP), 4,4'-bis(carbazol-9-yl)-9,9-dimethyl-fluorene (DMFL-CBP), 4,4'-bis(carbazol-9-yl)-9,9-bis(9-phenyl-9H-carbazol)fluorene (FL-4CBP), 4,4'-bis(carbazol-9-yl)-9,9-di-tolyl-fluorene (DPFL-CBP), 9,9-bis(9-phenyl-9H-carbazol)fluorene (FL-2CBP), or the like. Examples of the dopant material of the organic emission layer may include 4,4'-bis[4-(di-p-tolylamino)styryl]biphenyl (DPAVBi), 9,10-di(naph-2-tyl)anthracene (ADN), 3-tert-butyl-9,10-di(naph-2-tyl)anthracene (TBADN), or the like.

The second electrode 113 is formed on the intermediate layer 112. When the second electrode 113 functions as a cathode electrode, the second electrode 113 may be formed of a metal material including Ag, Mg, Al, Pt, Pd, Au, Ni, Nd, Ir, Cr, Li, or Ca. Also, in order to transmit light, the second electrode 113 may include a transparent material such as ITO, IZO, ZnO, or $In_2O_3$.

Here, the second electrode 113 may longitudinally extend so as to be electrically connected to the power supply wire 117 and the circuit wire 116 of the circuit unit C1.

When a voltage is applied across the first electrode 110 and the second electrode 113, a visible ray (or light) is emitted from the organic EML of the intermediate layer 112, so that an image that is recognizable to a user is realized.

An encapsulation member (not shown) may be disposed on the second electrode 113. The encapsulation member (not shown) may be arranged to protect the intermediate layer 112 and other layers against exterior moisture or oxygen, and may be formed of a flexible material including plastic. Alternatively, the encapsulation member (not shown) may be formed of an organic film and/or an inorganic film.

The flexible display apparatus 100 according to the present embodiment increases user convenience by including the flexible substrate 101 formed of a flexible material.

However, when the flexible display apparatus 100 is manufactured or is used, the flexible substrate 101 may be shriveled such that a flatness of the display apparatus may deteriorate. In particular, a region around the display region AA of the flexible substrate 101 in which various patterns are formed, that is, the region excluding the display region AA, is shriveled.

In a case where the aforementioned problem occurs during the manufacture of the flexible display apparatus 100, after the manufacture of the flexible display apparatus 100 is completed, a size of the flexible display apparatus 100 differs from a designed value. Also, characteristics of combinations between various members that are disposed in the flexible display apparatus 100, deteriorate. Due to the above-described problem, an image quality of the flexible display apparatus 100 deteriorates.

In addition, when the problem occurs during the use of the flexible display apparatus 100, a size of the flexible display apparatus 100 may change and its durability may deteriorate.

However, in the flexible display apparatus 100 according to the present embodiment, the problem is solved by disposing the deformation prevention unit 120 at a region around the display region AA of the flexible substrate 101. It is because the deformation prevention unit 120 is formed of a material having a greater rigidity than that of the flexible substrate 101. Therefore, it is possible to prevent abnormal deformation of the flexible substrate 101. In particular, because the deformation prevention unit 120 is disposed at an outer region of the display region AA of the flexible substrate 101, an aperture ratio of the flexible substrate 101 is not decreased.

Here, the deformation prevention unit 120 may be formed to be maximally adjacent (or as close as possible) to ends (or edge portions) of the flexible substrate 101. By doing so, a deformation prevention performance with respect to the flexible substrate 101 may be maximized or increased.

Also, because the deformation prevention unit 120 and the pad unit 150 are separated, an electrical characteristic of the pad unit 150 is not decreased, and a characteristic of a combination between the pad unit 150 and a flexible printed circuit (FPC) (not shown) is not decreased.

Also, in another example, the deformation prevention unit 120 may be formed of the same material as the gate electrode 105 on the same layer as the gate electrode 105, and by doing so, an additional process of patterning the deformation prevention unit 120 may be omitted. However, one or more embodiments are not limited thereto, and thus the deformation prevention unit 120 may be formed of the same material as the source electrode 107 or the drain electrode 108. Alternatively, the deformation prevention unit 120 may be formed of a material different from the gate electrode 105, the source electrode 107, or the drain electrode 108.

In the present embodiment, the interlayer insulating layer 106 is formed on the deformation prevention unit 120 so as to protect the deformation prevention unit 120 and to prevent the deformation prevention unit 120 from being separated from the flexible substrate 101.

The flexible display apparatus 100 according to the present embodiment is an organic light emitting display apparatus, but the flexible display apparatus 100 is not limited thereto. That is, the flexible display apparatus 100 may be a liquid crystal display (LCD) apparatus or may be one of various types of display apparatuses.

Also, in another embodiment, the TFT may not be included.

In addition, the circuit unit C1 of the display region AA in the present embodiment is an illustrative example, and thus a type of the circuit unit C1 may vary.

Figure 3:
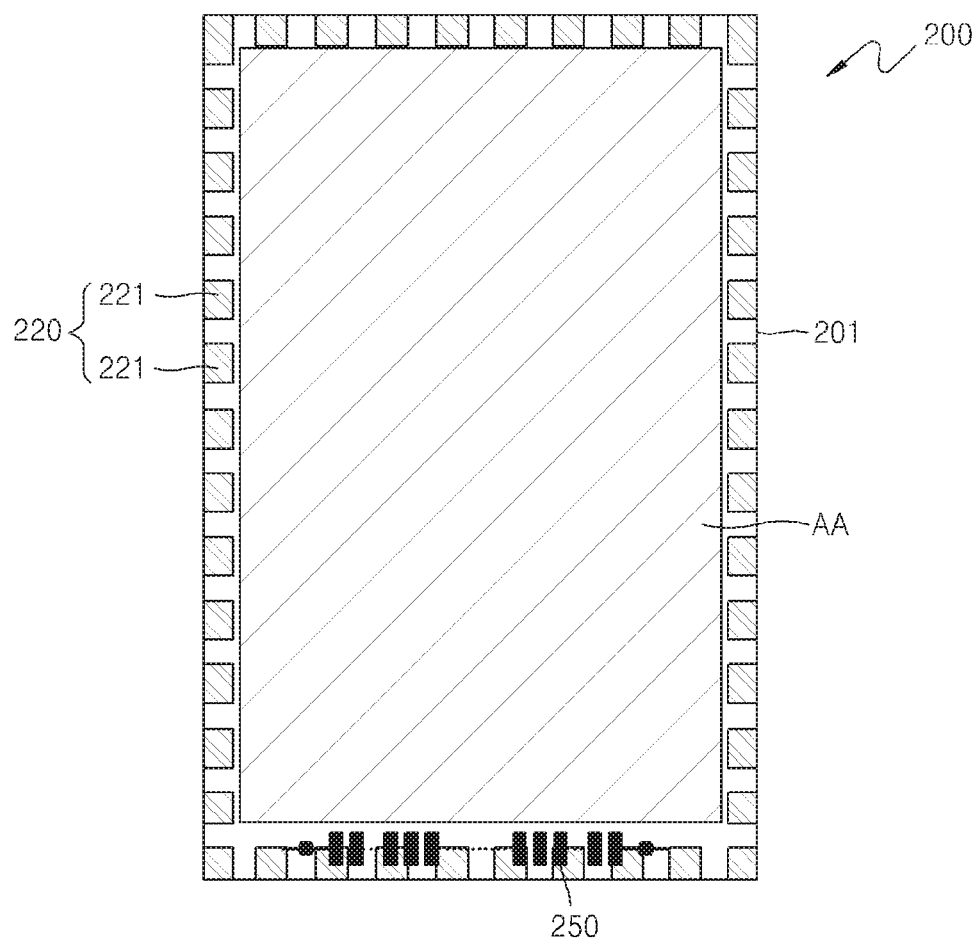
FIG. 3 is a plan view of a flexible display apparatus according to another embodiment of the present invention.

FIG. 3 is a plan view of a flexible display apparatus 200 according to another embodiment of the present invention.

Referring to FIG. 3, the flexible display apparatus 200 includes a flexible substrate 201 having a display region AA defined thereon, a pad unit 250, and a deformation prevention unit 220. For convenience of description, the present embodiment will be described with reference to the differences from the previous embodiment.

The display region AA is defined on the flexible substrate 201. A pixel unit (not shown) and a circuit unit (not shown) are formed at the display region AA. Similar to the previous embodiment, a first electrode (not shown), an intermediate layer (not shown), and a second electrode (not shown) may be formed in the pixel unit (not shown). That is, the flexible display apparatus 200 may be an organic light emitting display apparatus. However, the present embodiment is not limited thereto and thus may be applied to various display apparatuses.

The deformation prevention unit 220 is disposed around the display region AA. The deformation prevention unit 220 includes a plurality of deformation prevention patterns 221. The deformation prevention patterns 221 may be formed of the same material as a gate electrode (not shown) of a TFT (not shown) of the circuit unit. Alternatively, the deformation prevention patterns 221 may be formed of the same material as a source electrode (not shown) or a drain electrode (not shown) of the TFT (not shown).

The deformation prevention patterns 221 of the deformation prevention unit 220 are formed to correspond to sides or edge portions of the flexible substrate 201. Also, the deformation prevention patterns 221 may be disposed at set or predetermined intervals so as to correspond to side surfaces of the flexible substrate 201.

Although not illustrated, an interlayer insulating layer (not shown) may be formed to cover the deformation prevention unit 220.

In the flexible display apparatus 200 according to the present embodiment, the deformation prevention unit 220 is disposed around the display region AA of the flexible substrate 201, and by doing so, it is possible to prevent that the flexible substrate 201 is shriveled and thus is abnormally deformed.

The deformation prevention unit 220 of the flexible display apparatus 200 does not longitudinally extend along the sides of the flexible substrate 201 but includes the deformation prevention patterns 221 that are separated from each other. That is, a set or predetermined interval exists between the neighbouring deformation prevention patterns 221. Due to the set or predetermined interval, a stress that is applied to the deformation prevention unit 220 and the deformation prevention patterns 221 during the manufacture or the usage of the flexible display apparatus 200 may lessen. By doing so, a shock-resistance of the flexible display apparatus 200 may be reinforced or increased.

Figure 4:
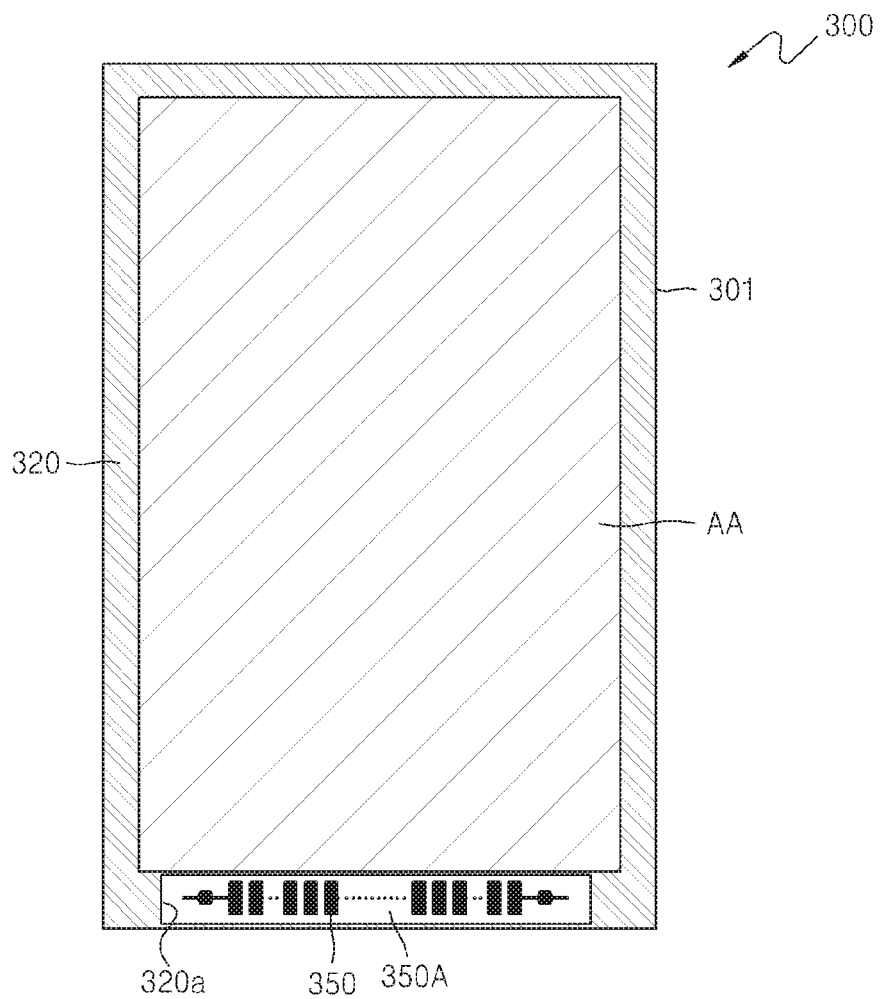
FIG. 4 is a plan view of a flexible display apparatus according to another embodiment of the present invention.

FIG. 4 is a plan view of a flexible display apparatus 300 according to another embodiment of the present invention.

Referring to FIG. 4, the flexible display apparatus 300 includes a flexible substrate 301 having a display region AA defined thereon, a pad unit 350, and a deformation prevention unit 320. For convenience of description, the present embodiment will be described with reference to the differences from the previous embodiment.

The display region AA is defined on the flexible substrate 301. A pixel unit (not shown) and a circuit unit (not shown) are formed at the display region AA. Similar to the previous embodiment, a first electrode (not shown), an intermediate layer (not shown), and a second electrode (not shown) may be formed in the pixel unit (not shown). That is, the flexible display apparatus 300 may be an organic light emitting display apparatus. However, the present embodiment is not limited thereto and thus may be applied to various display apparatuses.

A pad unit region 350A that longitudinally extends is defined adjacent to the display region AA. The pad unit 350 is formed in the pad unit region 350A.

The deformation prevention unit 320 is disposed around the display region AA. The deformation prevention unit 320 is formed to correspond to sides or edge portions of the flexible substrate 301.

The deformation prevention unit 320 includes an opening 320a. The opening 320a is formed to correspond to the pad unit region 350A. That is, the opening 320a longitudinally extends in the same manner as the pad unit region 350A.

In more detail, the deformation prevention unit 320 has the opening 320a corresponding to the pad unit region 350A so as to be separated from the pad unit 350, and longitudinally extends so as to correspond to side surfaces of the flexible substrate 301.

By doing so, the deformation prevention unit 320 may be separated from the pad unit 350 and may correspond to the sides of the flexible substrate 301.

The deformation prevention unit 320 is formed of a material having a greater rigidity than that of the flexible substrate 301.

Although not illustrated, a TFT may be formed in the display region AA of the flexible display apparatus 300, and the deformation prevention unit 320 may be formed of the same material as a gate electrode (not shown) of the TFT. Alternatively, the deformation prevention unit 320 may be formed of the same material as a source electrode (not shown) or a drain electrode (not shown) of the TFT (not shown).

Although not illustrated, an interlayer insulating layer (not shown) may be formed to cover the deformation prevention unit 320.

In the flexible display apparatus 300 according to the present embodiment, the deformation prevention unit 320 is disposed around the display region AA of the flexible substrate 301, and by doing so, it is possible to prevent that the flexible substrate 301 is shriveled and thus is abnormally deformed.

The deformation prevention unit 320 of the flexible display apparatus 300 includes the opening 320a that longitudinally extends so as to correspond to the pad unit region 350A. That is, when the deformation prevention unit 320 is formed, the deformation prevention unit 320 is not patterned to have multiple openings respectively corresponding to a plurality of patterns of the pad unit 350 such that the deformation prevention unit 320 is separated from each of the patterns of the pad unit 350, and it is patterned to form the opening 320a. Thus, the deformation prevention unit 320 may be easily patterned. Also, by doing so, the deformation prevention unit 320 and the pad unit 350 may be effectively separated.

Figure 5:
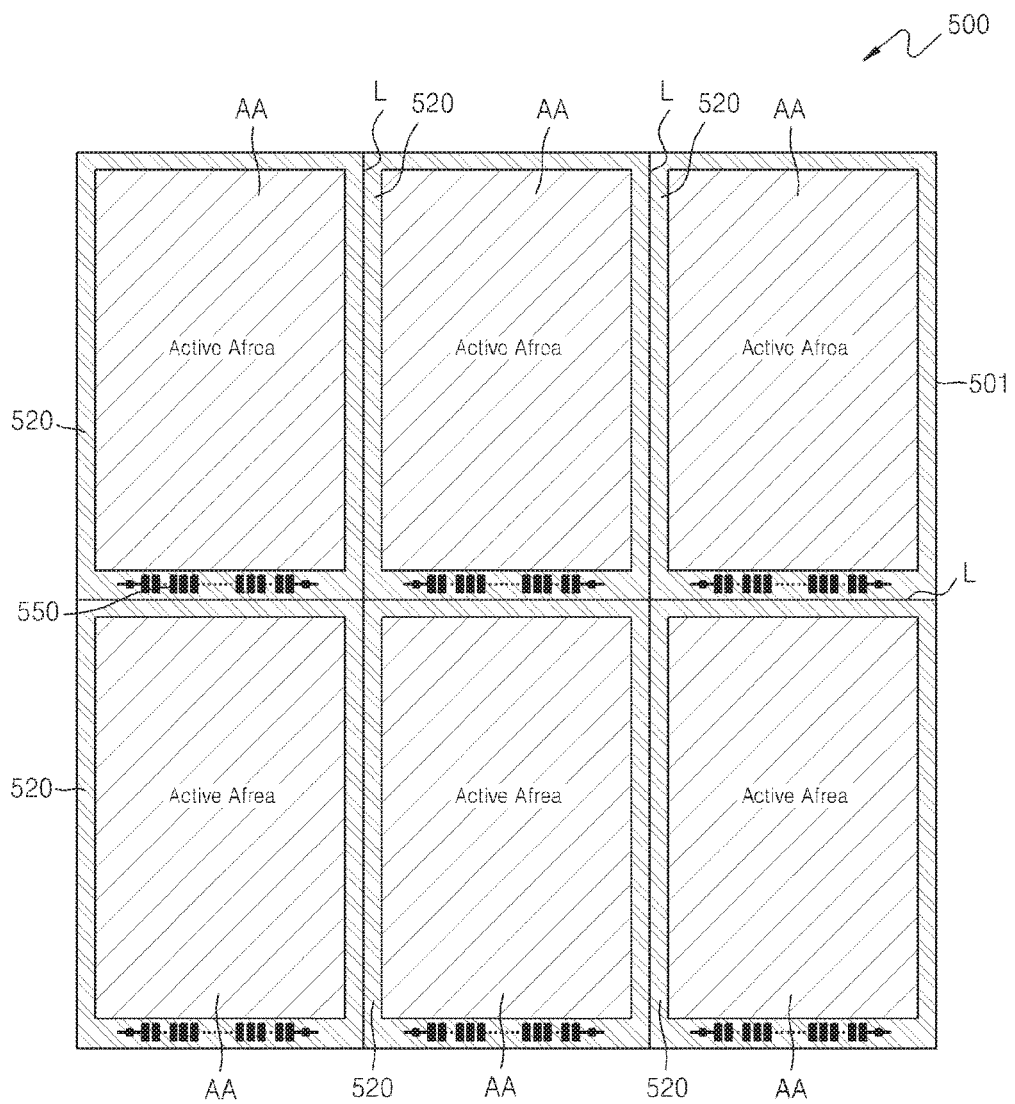
FIG. 5 is a plan view of a mother substrate for flexible display apparatus, according to an embodiment of the present invention.

FIG. 5 is a plan view of a mother substrate for flexible display apparatus 500, according to an embodiment of the present invention. For convenience of description, the present embodiment will be described with reference to differences from the previous embodiments.

Referring to FIG. 5, the mother substrate for flexible display apparatus 500 includes a flexible substrate 501 having six display regions AA defined thereon, 6 pad units 550, and 6 deformation prevention units 520. That is, the mother substrate for flexible display apparatus 500 may be a mother substrate that is used to manufacture six flexible display apparatuses. Section lines L shown in FIG. 5 define the six flexible display apparatuses. By scribing the section lines L, the six flexible display apparatuses may be finally completed.

The mother substrate for flexible display apparatus 500 according to the present embodiment may be used to manufacture the six flexible display apparatuses, but the number of flexible display apparatuses per mother substrate is not limited thereto. According to a design condition and a size of the flexible substrate 501, various number of flexible display apparatuses may be manufactured using the mother substrate.

The flexible substrate 501 is formed of a flexible material so as to be suitable bendable according to a user's desire. For example, the flexible substrate 501 may be formed of a plastic material.

Each of the display regions AA is defined on the corresponding flexible substrate 501. A pixel unit (not shown) and a circuit unit (not shown) are formed in the display region AA. The pixel unit (not shown) includes a first electrode (not shown), a second electrode (not shown), and an intermediate layer (not shown) so as to realize an image. That is, the mother substrate for flexible display apparatus 500 may be a mother substrate that is used to manufacture an organic light emitting display apparatus. However, the present embodiment is not limited thereto and thus may be applied to various display apparatuses.

The deformation prevention units 520 are disposed around the display regions AA, respectively. Each of the deformation prevention units 520 is formed of a material having a greater rigidity than that of the flexible substrate 501. Also, the deformation prevention units 520 are separated from the pad units 550, respectively. Each of the deformation prevention units 520 is formed to correspond to sides or edge portions of the corresponding flexible substrate 501. Also, the deformation prevention units 520 are formed to be adjacent to the section lines L that are formed between the display regions AA and thus function as final boundaries of the flexible display apparatuses. That is, the deformation prevention units 520 may have a lattice or matrix form.

Each of the deformation prevention units 520 has a form similar to the deformation prevention unit 120 of FIGS. 1 and 2. However, the form of the deformation prevention units 520 is not limited thereto, and in several embodiments, the mother substrate for flexible display apparatus 500 may have a configuration similar to the deformation prevention units 220 and 320 shown in FIGS. 3 and 4.

Also, although not illustrated, a TFT may be formed in each of the display regions AA of the mother substrate for flexible display apparatus 500, and the deformation prevention units 520 may be formed of the same material as a gate electrode (not shown) of the TFT. Alternatively, the deformation prevention units 520 may be formed of the same material as a source electrode (not shown) or a drain electrode (not shown) of the TFT (not shown).

Also, an interlayer insulating layer (not shown) may be formed to cover each of the deformation prevention units 520.

In the mother substrate for flexible display apparatus 500 according to the present embodiment, the deformation prevention units 520 are respectively disposed around the display regions AA of the flexible substrate 501, and by doing so, it is possible to prevent that the flexible substrate 501 is shriveled and thus is abnormally deformed. Accordingly, when the flexible display apparatuses are finally manufactured from the mother substrate for flexible display apparatus 500, the flexible display apparatuses may have excellent durability and an improved image quality while abnormal deformation of the flexible display apparatuses is prevented or reduced.

The flexible display apparatus, the organic light emitting display apparatus, and the mother substrate for flexible display apparatus according to the one or more embodiments of the present invention may have improved durability and image quality.

While the present invention has been particularly shown and described with reference to exemplary embodiments thereof, it will be understood by those of ordinary skill in the art that various changes in form and details may be made therein without departing from the spirit and scope of the present invention as defined by the following claims, and their equivalents.

What is claimed is:

1. A flexible display apparatus comprising:
a flexible substrate having a display region and a pad unit region adjacent to the display region, the display region comprising a pixel unit and a circuit unit, and the pad unit region comprising a pad unit; and
a deformation prevention unit around the display region, the deformation prevention unit having an opening corresponding to the pad unit region such that the deformation prevention unit is separated from the pad unit and is between the display region and the pad unit region, and comprising a material having a greater rigidity than that of the flexible substrate.

2. The flexible display apparatus of claim 1, wherein the deformation prevention unit comprises a metal material.

3. The flexible display apparatus of claim 1, wherein the deformation prevention unit corresponds to sides of the flexible substrate.

4. The flexible display apparatus of claim 1, wherein the deformation prevention unit longitudinally extends so as to correspond to at least one side surface of the flexible substrate.

5. The flexible display apparatus of claim 1, further comprising a thin film transistor (TFT) in the display region, the TFT comprising an active layer, a gate electrode, a source electrode, and a drain electrode,
wherein the deformation prevention unit comprises the same material as at least one of the gate electrode, the source electrode, or the drain electrode.

6. The flexible display apparatus of claim 5, further comprising a gate insulating layer between the gate electrode and the active layer,
wherein the deformation prevention unit, the gate electrode, and the pad unit are on the gate insulating layer.

7. The flexible display apparatus of claim 5, further comprising an interlayer insulating layer between the gate electrode and the source electrode and between the gate electrode and the drain electrode,
wherein the interlayer insulating layer is on the deformation prevention unit.

8. The flexible display apparatus of claim 5, wherein the deformation prevention unit, the gate electrode, and the pad unit are on the same layer.

9. The flexible display apparatus of claim 1, wherein the deformation prevention unit extends around a periphery of the pad unit region to be between the display region and the pad unit region and between the pad unit region and a side surface of the flexible substrate which faces the pad unit region.

10. A flexible display apparatus comprising:
a flexible substrate having a display region and a pad unit region adjacent to the display region, the display region comprising a pixel unit and a circuit unit, and the pad unit region comprising a pad unit; and
a deformation prevention unit around the display region and longitudinally extending so as to correspond to side surfaces of the flexible substrate except for one of the side surfaces of the flexible substrate which faces the pad unit such that the deformation prevention unit is separated from the pad unit, and the deformation prevention unit comprises a material having a greater rigidity than that of the flexible substrate.

11. The flexible display apparatus of claim 10, wherein the deformation prevention unit comprises a metal material.

12. An organic light emitting display apparatus comprising:
a flexible substrate;
a display region defined on the flexible substrate and comprising a pixel unit and a circuit unit;
a pad unit adjacent to the display region;
a first electrode in the pixel unit;
a second electrode in the pixel unit;

an intermediate layer in the pixel unit and between the first electrode and the second electrode, the intermediate layer comprising an organic emission layer (organic EML); and a deformation prevention unit around the display region, the deformation prevention unit having an opening corresponding to the pad unit such that the deformation prevention unit is separated from the pad unit, and comprising a material having a greater rigidity than that of the flexible substrate, wherein the deformation prevention unit extends around a periphery of the pad unit to be between the display region and the pad unit and between the pad unit and a side surface of the flexible substrate which faces the pad unit.

13. The organic light emitting display apparatus of claim 12, wherein the deformation prevention unit comprises a metal material.

14. The organic light emitting display apparatus of claim 12, wherein the deformation prevention unit corresponds to sides of the flexible substrate.

15. The organic light emitting display apparatus of claim 12, wherein the deformation prevention unit longitudinally extends so as to correspond to at least one side surface of the flexible substrate.

16. The organic light emitting display apparatus of claim 12, wherein the deformation prevention unit longitudinally extends so as to correspond to side surfaces of the flexible substrate, except for one side surface of the flexible substrate which faces the pad unit.

17. The organic light emitting display apparatus of claim 12, further comprising a thin film transistor (TFT) in the display region, the TFT being electrically connected to the first electrode, and comprising an active layer, a gate electrode, a source electrode, and a drain electrode, wherein the deformation prevention unit comprises the same material as at least one of the gate electrode, the source electrode, or the drain electrode.

18. The organic light emitting display apparatus of claim 17, further comprising a gate insulating layer between the gate electrode and the active layer, wherein the deformation prevention unit, the gate electrode, and the pad unit are on the gate insulating layer.

19. The organic light emitting display apparatus of claim 17, further comprising an interlayer insulating layer between the gate electrode and the source electrode and between the gate electrode and the drain electrode, wherein the interlayer insulating layer is on the deformation prevention unit.

* * * * *